United States Patent
Niwa et al.

(10) Patent No.: US 11,430,914 B2
(45) Date of Patent: Aug. 30, 2022

(54) SEMICONDUCTOR LIGHT EMITTING DEVICE AND METHOD OF MANUFACTURING SEMICONDUCTOR LIGHT EMITTING DEVICE

(71) Applicant: NIKKISO CO., LTD., Tokyo (JP)

(72) Inventors: Noritaka Niwa, Hakusan (JP); Tetsuhiko Inazu, Hakusan (JP); Yasumasa Suzaki, Kawasaki (JP); Akifumi Nawata, Kawasaki (JP); Satoru Tanaka, Kawasaki (JP)

(73) Assignee: NIKKISO CO., LTD., Tokyo (JP)

( * ) Notice: Subject to any disclaimer, the term of this patent is extended or adjusted under 35 U.S.C. 154(b) by 153 days.

(21) Appl. No.: 16/727,539

(22) Filed: Dec. 26, 2019

(65) Prior Publication Data

US 2020/0144450 A1    May 7, 2020

Related U.S. Application Data

(63) Continuation of application No. PCT/JP2018/022683, filed on Jun. 14, 2018.

(30) Foreign Application Priority Data

Jun. 26, 2017   (JP) .............................. JP2017-124546

(51) Int. Cl.
*H01L 33/22* (2010.01)
*H01L 33/12* (2010.01)
(Continued)

(52) U.S. Cl.
CPC ............ *H01L 33/22* (2013.01); *H01L 33/007* (2013.01); *H01L 33/12* (2013.01); *H01L 33/325* (2013.01); *H01L 33/06* (2013.01); *H01L 33/145* (2013.01)

(58) Field of Classification Search
CPC combination set(s) only.
See application file for complete search history.

(56) References Cited

U.S. PATENT DOCUMENTS

2005/0285132 A1    12/2005  Orita
2010/0072501 A1*   3/2010   Wakai .................... H01L 33/44
                                                               257/98
(Continued)

FOREIGN PATENT DOCUMENTS

EP    3 026 716 A1    6/2016
JP    2009 010215 A   1/2009
(Continued)

OTHER PUBLICATIONS

Office Action dated Jun. 2, 2020 in Japanese Application No. 2017-124546.
(Continued)

*Primary Examiner* — Moin M Rahman
*Assistant Examiner* — Mohammad A Rahman
(74) *Attorney, Agent, or Firm* — Muncy, Geissler, Olds & Lowe, P.C.

(57) ABSTRACT

A semiconductor light emitting device includes a light extraction layer having a light extraction surface. Multiple cone-shaped parts formed in an array are provided on the light extraction surface of the semiconductor light emitting device. A proportion of an area occupied by the multiple cone-shaped parts per a unit area of the light extraction surface is not less than 65% and not more than 95% in a plan view of the light extraction surface, and an aspect ratio h/p defined as a proportion of a height h of the cone-shaped part relative to a distance p between apexes of adjacent cone-shaped parts is not less than 0.3 and not more than 1.0.

6 Claims, 10 Drawing Sheets

(51) Int. Cl.
   *H01L 33/32* (2010.01)
   *H01L 33/06* (2010.01)
   *H01L 33/00* (2010.01)
   *H01L 33/14* (2010.01)

(56) References Cited

U.S. PATENT DOCUMENTS

| | | | |
|---|---|---|---|
| 2013/0112987 A1 | 5/2013 | Fu et al. | |
| 2014/0167066 A1* | 6/2014 | Kashima | H01L 33/44 257/76 |
| 2015/0129833 A1* | 5/2015 | Yun | H01L 33/24 257/13 |
| 2017/0207410 A1* | 7/2017 | Cho | H01L 51/0023 |

FOREIGN PATENT DOCUMENTS

| | | |
|---|---|---|
| JP | 2009016879 A | 1/2009 |
| JP | 2010074008 A | 4/2010 |
| JP | 2013222925 A | 10/2013 |
| JP | 5594530 B | 9/2014 |
| JP | 2016012684 A | 1/2016 |
| JP | 2016139780 A | 8/2016 |
| JP | 2017063099 A | 3/2017 |
| JP | 2017098467 A | 6/2017 |
| WO | WO-2015016150 A1 | 2/2015 |

OTHER PUBLICATIONS

Office Action dated Sep. 1, 2020 in JP Application No. 2017-124546 (5 pages).
Wei et al., "Efficiency improvement and spectral shift of an organic light-emitting device by attaching a hexagon-based microlens array," Journal of Optics A: Pure and Applied Optics, vol. 10, 2008, 9 pages.
Kuang et al., "Hexagonal microlens array fabricated by direct laser writing and inductively coupled plasma etching on organic light emitting devices to enhance the outcoupling efficiency," Applied Optics, vol. 48, No. 5, Feb. 10, 2009, 5 pages.
Notice of Submission of Information mailed on Jun. 30, 2020 in corresponding JP Application No. 2017-124546, 7 pages.
International Preliminary Report on Patentability of PCT/JP2018/022683, dated May 15, 2019, 8 pages.
International Search Report of PCT/JP2018/022683, dated Aug. 7, 2018, 3 pages.
Written Opinion of PCT/JP2018/022683, dated Aug. 7, 2018, 4 pages.
Pernot et al., "Improved Efficiency of 255-280nm AlGanN-Based Light-Emitting Diodes," Applied Physics Express, 2010, pp. 061004-1-061004-3, 3 pages.
Extended European Search Report issued in corresponding EP application No. 18 82 2829 dated Jan. 14, 2021 (8 pages).
Office Action issued in corresponding JP application No. 2017-124546 dated Dec. 1, 2020 (4 pages).

* cited by examiner

SEMICONDUCTOR LIGHT EMITTING DEVICE AND METHOD OF MANUFACTURING SEMICONDUCTOR LIGHT EMITTING DEVICE

RELATED APPLICATION

Priority is claimed to Japanese Patent Application No. 2017-124546, filed on Jun. 26, 2017, the entire content of which is incorporated herein by reference.

BACKGROUND

1. Field of the Invention

The present invention relates to semiconductor light emitting devices.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued.

A light emitting device for emitting deep ultraviolet light includes an aluminum gallium nitride (AlGaN) based n-type clad layer, active layer, p-type clad layer, etc. stacked successively on a substrate. Deep ultraviolet light emitted by the active layer is output from a light extraction surface of the substrate.

It is known that the external quantum efficiency of deep ultraviolet light output via the light extraction surface of the substrate of a deep ultraviolet light emitting device is as low as several % and that the shorter the wavelength of emitted light, the lower the external quantum efficiency.

SUMMARY

In this background, one illustrative purpose of the present invention is to provide a technology of increasing the light extraction efficiency of semiconductor light emitting devices.

A semiconductor light emitting device according to an embodiment of the present invention is a semiconductor light emitting device including a light extraction layer having a light extraction surface, multiple cone-shaped parts formed in an array being provided on the light extraction surface. A proportion of an area occupied by the multiple cone-shaped parts per a unit area of the light extraction surface is not less than 65% and not more than 95% in a plan view of the light extraction surface, and an aspect ratio h/p defined as a proportion of a height h of the cone-shaped part relative to a distance p between apexes of adjacent cone-shaped parts is not less than 0.3 and not more than 1.0.

According to this embodiment, the concave-convex structure provided by forming multiple cone-shaped parts in an array on the light extraction surface inhibits total reflection of light occurring inside the light extraction surface and increases the efficiency of light output from the light extraction surface. To increase the light extraction efficiency, it is desirable to increase the proportion of the area occupied by the cone-shaped parts on the light extraction surface and to increase the aspect ratio of the cone-shaped part to 1.1 or larger. However, it is difficult to realize a shape that meets both of these requirements. We have found that the light extraction efficiency is suitably improved by controlling the aspect ratio of the cone-shaped part to be in a range 0.3-1.0 and configuring the proportion of the area occupied by the cone-shaped parts to be not less than 65% and not more than 95%. Accordingly, the embodiment makes it possible to improve the light extraction efficiency suitably by using a concave-convex structure of a shape that can be easily or possibly realized.

In a plan view of the light extraction surface, a bottom the cone-shaped part may have a shape of a hexagon or a shape intermediate between a hexagon and a circle, and the proportion of the area occupied by the multiple cone-shaped parts per a unit area of the light extraction surface may be not less than 91% and not more than 95%.

In a cross-sectional view perpendicular to a direction of height of the cone-shaped part, a neighborhood of the bottom of the cone-shaped part may have a hexagonal shape or a shape intermediate between a hexagon and a circle, and a neighborhood of the apex of the cone-shaped part may have a shape closer to a circle than the neighborhood of the bottom.

The cone-shaped part may have a first portion having a first angle of inclination of a side surface and a second portion having a second angle of inclination of a side surface smaller than the first angle. The second portion is closer to the apex of the cone-shaped part than the first portion and has a larger height than the first portion.

A height of the second portion may be not less than 1.1 times and not more than three times a height of the first portion.

The first angle may be not less than 60° and not more than 85°, and the second angle may be not less than 40° and not more than 60°.

The semiconductor light emitting device may include: a base structure including at least one of a sapphire ($Al_2O_3$) layer and an aluminum nitride (AlN) layer; and a light emitting structure formed on the base structure and including an aluminum gallium nitride (AlGaN)-based or a gallium nitride (GaN)-based semiconductor layer that emits ultraviolet light of a wavelength of not less than 200 nm and not more than 400 nm. The light extraction layer may be the sapphire ($Al_2O_3$) layer, the AlN layer or a silicon oxide ($SiO_x$) layer, or a silicon nitride layer ($SiN_x$) or an aluminum oxide layer ($Al_2O_3$) of the base structure.

Another embodiment of the present invention relates to a method of manufacturing a semiconductor light emitting device. The method is directed to manufacturing a semiconductor light emitting device including a light extraction layer having a light extraction surface, the method comprising: forming a mask having an array pattern on the light extraction layer; and etching the mask and the light extraction layer from above the mask. The etching includes first dry-etching for dry-etching the mask and the light extraction layer until the entirety of the mask is removed and second dry-etching for further dry-etching the light extraction layer after the mask is removed. Multiple cone-shaped parts are formed in an array on the light extraction surface in the first dry-etching such that an aspect ratio h/p defined as a proportion of a height h of the cone-shaped part relative to a distance p between apexes of adjacent cone-shaped parts is 1.1 or larger, and the multiple cone-shaped parts are further etched in the second dry-etching such that the aspect ratio h/p of the cone-shaped part is not less than 0.3 and not more than 1.0.

The embodiment makes it possible configure the proportion of the area occupied by the multiple cone-shaped parts formed after the second dry-etching to be larger than the proportion of the area occupied by the multiple cone-shaped parts formed after the first dry-etching. This makes it easier to manufacture a light extraction surface having an improved light extraction efficiency by using a mask that can be easily or possibly manufactured.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
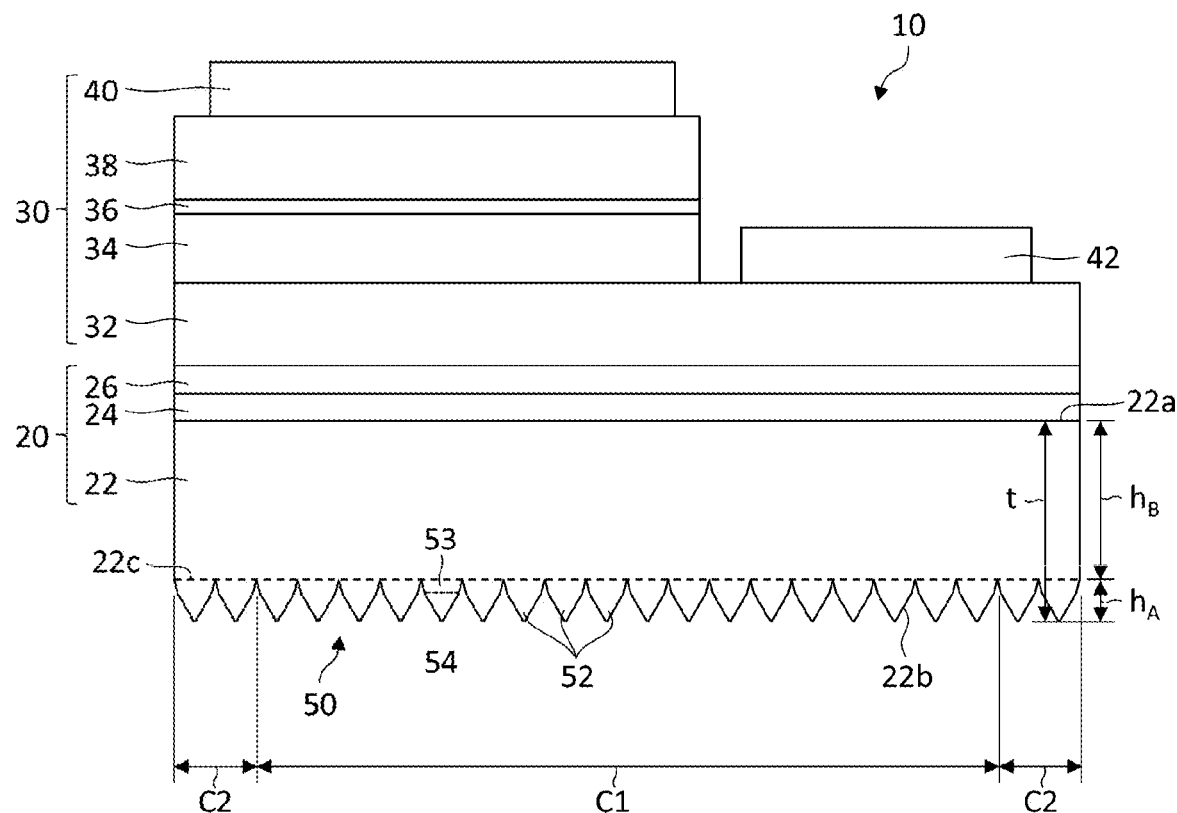
FIG. 1 is a cross sectional view schematically showing a configuration of a semiconductor light emitting device according to the embodiment.

The invention will now be described by reference to the preferred embodiments. This does not intend to limit the scope of the present invention, but to exemplify the invention.

A detailed description will be given of embodiments to practice the present invention with reference to the drawings. Same numerals are used in the description to denote same elements and a duplicate description is omitted as appropriate. To facilitate the understanding, the relative dimensions of the constituting elements in the drawings do not necessarily mirror the relative dimensions in the actual apparatus.

FIG. 1 is a cross sectional view schematically showing a configuration of a semiconductor light emitting device 10 according to the embodiment. The semiconductor light emitting device 10 includes a base structure 20 and a light emitting structure 30. The base structure 20 includes a substrate 22, a first base layer 24, and a second base layer 26. The light emitting structure 30 includes an n-type clad layer 32, an active layer 34, an electron blocking layer 36, a p-type clad layer 38, a p-side electrode 40, and an n-side electrode 42.

The semiconductor light emitting device 10 is a semiconductor light emitting device configured to emit "deep ultraviolet light" having a central wavelength of about 365 nm or shorter. To output deep ultraviolet light having such a wavelength, the active layer 34 is made of an aluminum gallium nitride (AlGaN)-based semiconductor material having a band gap of about 3.4 eV or larger. In this embodiment, the case of emitting deep ultraviolet light having a central wavelength of about 310 nm or shorter is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The substrate 22 is a sapphire ($Al_2O_3$) substrate. The substrate 22 may be an aluminum nitride (AlN) substrate in one variation. The substrate 22 includes a first principal surface 22a and a second principal surface 22b opposite to the first principal surface 22a. The first principal surface 22a is a principal surface that is a crystal growth surface. For example, the first principal surface 22a is the (0001) plane of the sapphire substrate. The second principal surface 22b is a principal surface that is the light extraction surface and is formed with a micro-concave-convex structure (texture structure) 50 of a submicron scale. The detail of the concave-convex structure 50 will be described later.

The substrate 22 has a thickness t of 1 μm or larger. For example, the substrate 22 has a thickness of about 5 μm, 10 μm, 100 μm, 300 μm, or 500 μm. The thickness t of the substrate 22 is twice the height $h_A$ of the concave-convex structure 50 or larger. Typically, the thickness t is ten times the height $h_A$ of the concave-convex structure 50 or larger. Therefore, the height $h_B$ from the first principal surface 22a of the substrate 22 to a boundary surface 22c bordering the concave-convex structure 50 is larger than the height $h_A$ of the concave-convex structure 50 and twice the height $h_A$ of the concave-convex structure $h_A$ or larger.

The first base layer 24 and the second base layer 26 are stacked on the first principal surface 22a of the substrate 22. The first base layer 24 is a layer made of an AlN-based semiconductor material and is, for example, an AlN(HT-AlN) layer gown at a high temperature. The second base layer 26 is a layer made of an AlGaN-based semiconductor material and is, for example, an undoped AlGaN(u-AlGaN) layer.

The substrate 22, the first base layer 24, and the second base layer 26 function as a foundation layer (template) to form the n-type clad layer 32 and the layers above. These layers also function as a light extraction layer for extracting the deep ultraviolet light emitted by the active layer 34 outside and transmit the deep ultraviolet light emitted by the active layer 34. It is preferred that the first base layer 24 and the second base layer 26 be made of an AlGaN-based or AlN-based material having an AlN ratio higher than that of the active layer 34 so as to increase the transmittance for the deep ultraviolet light emitted by the active layer 34. It is further preferred that the first base layer 24 and the second base layer 26 be made of a material having a lower refractive index than the active layer 34. It is also preferred that the first base layer 24 and the second base layer 26 be made of a material having a higher refractive index than the substrate 22. Given that the substrate 22 is a sapphire substrate (the refractive index $n_1$=about 1.8) and the active layer 34 is a made of an AlGaN-based semiconductor material (the refractive index $n_3$=about 2.4~2.6), for example, it is preferred that the first base layer 24 and the second base layer 26 be made of an AlN layer (the refractive index $n_2$=about 2.1) or an AlGaN-based semiconductor material (the refractive index $n_2$=about 2.2~2.3) having a relatively higher AlN composition ratio.

The n-type clad layer 32 is an n-type semiconductor layer provided on the second base layer 26. The n-type clad layer 32 is made of an n-type AlGaN-based semiconductor material. For example, the n-type clad layer 32 is an AlGaN layer doped with silicon (Si) as an n-type impurity. The composition ratio of the n-type clad layer 32 is selected to transmit the deep ultraviolet light emitted by the active layer 34. For example, the n-type clad layer 32 is formed such that the molar fraction of AlN is 40% or higher, and, preferably, 50% or higher. The n-type clad layer 32 has a band gap larger than the wavelength of the deep ultraviolet light emitted by the active layer 34. For example, the n-type clad layer 32 is formed to have a band gap of 4.3 eV or larger. The n-type clad layer 32 has a thickness of about 100 nm~300 nm. For example, the n-type clad layer 32 has a thickness of about 200 nm.

The active layer 34 is formed in a partial region on the n-type clad layer 32. The active layer 34 is made of an AlGaN-based semiconductor material and has a double heterojunction structure by being sandwiched by the n-type clad layer 32 and the electron blocking layer 36. The active layer 34 may form a monolayer or multilayer quantum well structure. The quantum well structure like this can be formed by building a stack of a barrier layer made of an undoped AlGaN-based semiconductor material and a well layer made of an undoped AlGaN-based semiconductor material. To output deep ultraviolet light having a wavelength of 355 nm or shorter, the active layer 34 is formed to have a band gap of 3.4 eV or larger. For example, the AlN composition ratio of the active layer 34 is selected so as to output deep ultraviolet light having a wavelength of 310 nm or shorter.

The electron blocking layer 36 is formed on the active layer 34. The electron blocking layer 36 is a layer made of a p-type AlGaN-based semiconductor material and is exemplified by an undoped AlGaN layer. The electron blocking layer 36 is formed such that the molar fraction of AlN is 40% or higher, and, preferably, 50% or higher. The electron blocking layer 36 may be formed such that the molar fraction of AlN is 80% or higher or may be made of an AlN-based semiconductor material that does not substantially contain GaN. The electron blocking layer 36 may be made of an AlGaN-based semiconductor material or an AlN-based semiconductor material doped with magnesium (Mg) as a p-type impurity. The electron blocking layer 36 has a thickness of about 1 nm~10 nm. For example, the electron blocking layer 36 has a thickness of about 2 nm~5 nm.

The p-type clad layer 38 is formed on the electron blocking layer 36. The p-type clad layer 38 is a layer made of a p-type AlGaN-based semiconductor material and is exemplified by a Mg-doped AlGaN layer. The composition ratio of the p-type clad layer 38 is selected such that the molar fraction of AlN in the p-type clad layer 38 is lower than that of the electron blocking layer 36. The p-type clad layer 38 has a thickness of about 300 nm~700 nm. For example, the p-type clad layer 38 has a thickness of about 400 nm~600 nm.

The p-side electrode 40 is provided on the p-type clad layer 38. The p-side electrode 40 is made of a material capable of establishing ohmic contact with the p-type clad layer 38. For example, the p-side electrode 40 is formed by a nickel (Ni)/gold (Au) stack structure.

The n-side electrode 42 is provided on the n-type clad layer 32. For example, the n-side electrode 42 is a Ti/Al-based electrode and is formed by, for example, a titanium (Ti)/Al/Ti/Au or Ti/Al/Ni/Au stack structure.

The concave-convex structure 50 is formed on the second principal surface (also referred to as the light extraction surface) 22b of the substrate 22 that is the light extraction layer. The concave-convex structure 50 inhibits reflection or total reflection on the second principal surface 22b and increases the light extraction efficiency of deep ultraviolet light output from the second principal surface 22b. The concave-convex structure 50 has multiple cone-shaped parts 52 formed in an array on the light extraction surface. The cone-shaped part 52 is made of the same material as the substrate 22. For example, the cone-shaped part 52 is made of sapphire ($Al_2O_3$) or aluminum nitride (AlN).

The cone-shaped part 52 has a first portion 53 having a relatively large angle of inclination of the side surface and a second portion 54 having a relatively small angle of inclination of the side surface. The first portion 53 is located toward the bottom of the cone-shaped part 52 (toward the top of the plane of paper of FIG. 1), and the second portion 54 is located toward the apex of the cone-shaped part 52 (toward the bottom of the plane of paper of FIG. 1).

Referring to FIG. 1, the concave-convex structure 50 is formed on substantially the entirety of the second principal surface 22b. The concave-convex structure 50 may be formed only in a restricted area on the second principal surface 22b. For example, the concave-convex structure 50 may be formed only in an inner region C1 of the second principal surface 22b and may not be formed in an outer region C2. The size of the outer region C2 is not limited to a particular size. For example, the outer region C2 extends in a range of about 1 μm~50 μm.

Figure 2:
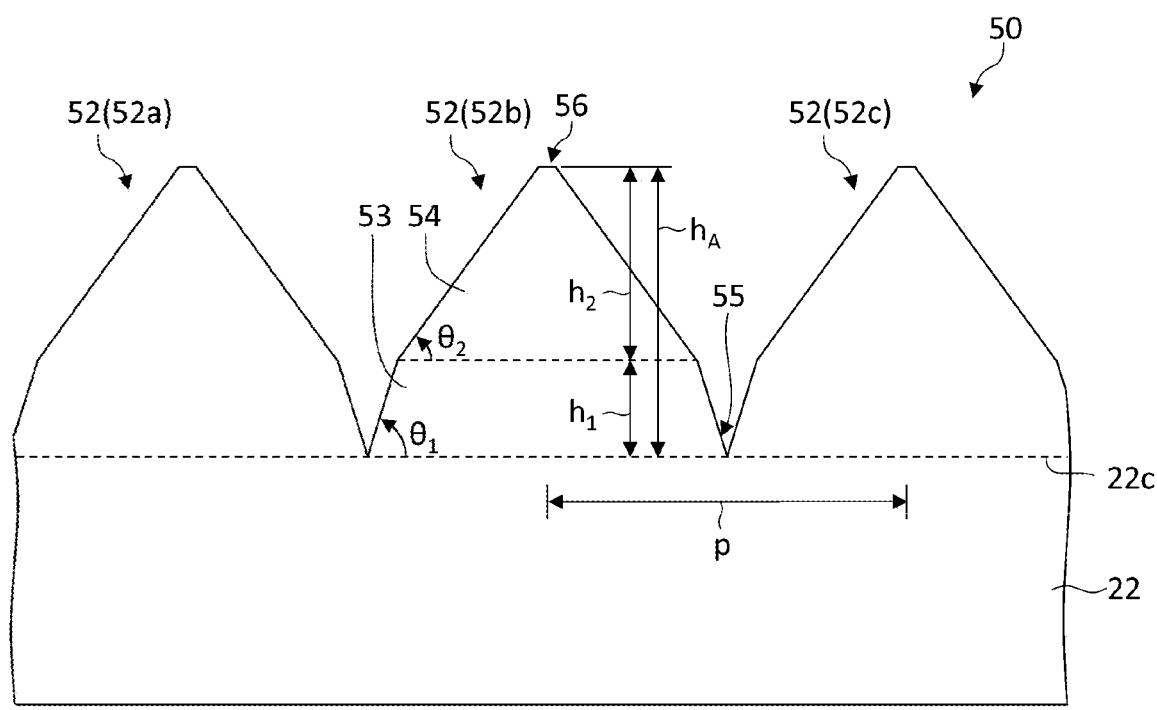
FIG. 2 is a cross-sectional view schematically showing a configuration of the concave-convex structure.

FIG. 2 is a cross-sectional view schematically showing a configuration of the concave-convex structure 50 and represents a partial enlarged view of FIG. 1. FIG. 2 is oriented upside down relative to FIG. 1. The multiple cone-shaped parts 52 (52a, 52b, 52c) are arranged at a predetermined pitch p. The pitch p of the cone-shaped parts 52 is defined as a distance between apexes 56 of adjacent cone-shaped parts 52 (e.g., 52b and 52c). The cone-shaped parts 52 is formed such that the pitch p between adjacent cone-shaped parts 52 is not less than 100 nm and not more than 1000 nm, and, for example, not less than 250 nm and not more than 600 nm.

The multiple cone-shaped parts 52 are formed to have a substantially uniform height $h_A$. The height $h_A$ of the cone-shaped part 52 is not less than 150 nm and not more than 900 nm and, preferably, not less than 240 nm and not more than 600 nm. The height $h_A$ of the cone-shaped part 52 is not less than 0.3 times and not more than 1.5 times and, preferably, not less than 0.5 times and not more than 1.0 times the pitch p of the cone-shaped part 52. Given that the pitch p of the cone-shaped parts 52 is 400 nm, for example, the height h of the cone-shaped part 52 is not less than 120 nm and not more than 600 nm and, preferably, not less than 200 nm and not more than 400 nm. The height $h_A$ of the cone-shaped part 52 may have certain (e.g., 5%~30%) variability.

The cone-shaped part 52 has the first portion 53 having a first angle $\theta_1$ of inclination of the side surface and the second portion 54 having a second angle $\theta_2$ of inclination of the side surface. The first portion 53 is a portion including a bottom 55 of the cone-shaped part 52, and the second portion 54 is a portion including the apex 56 of the cone-shaped part 52. The first angle $\theta_1$ of the first portion 53 is an angle formed by the side surface of the cone-shaped part 52 and the boundary surface 22c that could be seen as the bottom surface of the cone-shaped part 52 and is an angle of inclination of the side surface at the bottom 55 of the cone-shaped part 52. Meanwhile, the second angle $\theta_2$ of the second portion 54 is an angle of inclination of the side surface near the boundary between the first portion 53 and the second portion 54.

Comparing the first angle $\theta_1$ with the second angle $\theta_2$, the first angle $\theta_1$ is larger than the second angle $\theta_2$ (i.e., $\theta_1 > \theta_2$). Therefore, the cone-shaped part 52 is shaped such that the inclination of the side surface is gentler near the apex 56 than near the bottom 55. The first angle $\theta_1$ is 45° or larger and, preferably, not less than 60° and not more than 85°. The second angle $\theta_2$ is 60° or smaller and, preferably, not less than 40° and not more than 60°. An angle difference $\Delta\theta$ ($\theta_1 - \theta_2$) between the first angle $\theta_1$ and the second angle $\theta_2$ is preferably 10° or larger, and more preferably, 15° or larger or 20° or larger.

In the cone-shaped part 52, the height $h_2$ of the second portion 54 is larger than the height $h_1$ of the first portion 53. The height $h_2$ of the second portion 54 is preferably 1.1 times the height $h_1$ of the first portion 53 or larger and, more preferably, 1.5 times the height $h_1$ or larger. For example, the height $h_2$ of the second portion 54 is about twice~three times the height $h_1$ of the first portion 53. Therefore, the height $h_2$ of the second portion 54 preferably occupies 50% or larger of the total height $h_A$ of the cone-shaped part 52 and, more preferably, occupies 60%~75% of the total height $h_A$. Also, the height $h_2$ of the second portion 54 is preferably 80% or smaller than the total height $h_A$ of the cone-shaped part, and the first portion 53 occupies a certain proportion (20% or larger).

The side surface of each of the first portion 53 and the second portion 54 of the cone-shaped part 52 illustrated has a constant angle of inclination, and the side surface is formed to be straight in a cross-sectional view of FIG. 2 perpendicular to the boundary surface 22c. However, the angle of inclination of the side surface of the first portion 53 and the second portion 54 may not be constant, and the side surface may be shaped such that the angle of inclination varies gradually. For example, the first portion 53 may be shaped such that the angle of inclination $\theta_1$ is substantially constant, and the second portion 54 may be shaped such that the angle of inclination $\theta_2$ grows gradually smaller toward the apex 56. For example, the side surface of the second portion 54 may be convexly curved outward from the cone-shaped part 52.

Figure 3:
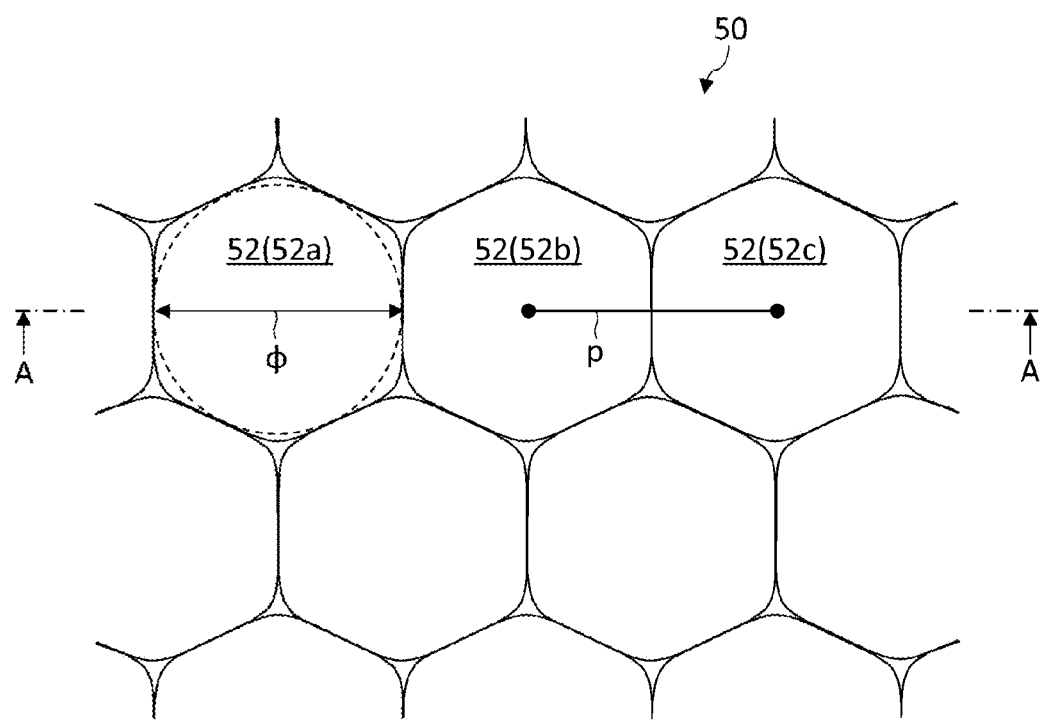
FIG. 3 is a top view schematically showing a configuration of the concave-convex structure.

FIG. 3 is a top view schematically showing a configuration of the concave-convex structure 50 and schematically shows an arrangement of the multiple cone-shaped parts 52 of FIG. 2. FIG. 2 corresponds to an A-A cross section of FIG. 3. The multiple cone-shaped parts 52 are arranged in a triangular grid pattern as illustrated. In a plan view of the light extraction surface 22b, the outer profile of the cone-shaped part 52 has a shape similar to a hexagon and has a shape intermediate between a hexagon and a circle. The term "a shape intermediate between a hexagon and a circle" refers to a shape in which the profile line is substantially located in a region between a hexagon and an inscribed circle thereof and refers to a shape produced by rounding the corners of a heptagon or a polygon having a larger number of corners (e.g., octagon, dodecagon, icositetragon) or of a hexagon or a polygon having a larger number or corners. For example, the cone-shaped part may be shaped such that 10% or larger or, preferably, 20% or larger of the area between a hexagon and an inscribed circle thereof is located inside the profile line. In the case of "a shape intermediate between a hexagon and a circle" like this, the area occupied will be larger than the area of the reference circle (e.g., the inscribed circle). Thus, by causing the outer profile of the cone-shaped part 52 to be similar to a hexagon to present "a shape intermediate between a hexagon and a circle", the proportion of the area occupied by the multiple cone-shaped parts 52 per a unit area in a plan view of the second principal surface 22b is increased accordingly. Provided that the circular cone-shaped parts 52 are arranged in a hexagonal close packed pattern, for example, the proportion of the area occupied would be approximately 90%. By causing the outer profile of the cone-shaped parts 52 to be similar to a hexagon, the proportion can be increased to 91% or higher.

The cone-shaped part 52 may be shaped such that the plan view of the second principal surface 22b, i.e., the cross section perpendicular to the direction of height of the cone-shaped part 52 varies in the direction of height. For example, the cross-sectional shape of the first portion 53 perpendicular to the direction of height may be different from the cross-sectional shape of the second portion 54 perpendicular to the direction of height. The cross-sectional shape of the first portion 53 perpendicular to the direction of height may be a shape intermediate between a hexagon and a circle, and the cross-sectional shape of the second portion 54 perpendicular to the direction of height may have a shape closer to a circle than the first portion. For example, the cross-sectional shape of the second portion 54 perpendicular to the direction of height may have corners more rounded and having smaller curvature (i.e., larger radius of curvature) than those of the cross sectional-shape of the first portion 53 perpendicular to the direction of height. The shape difference between the first portion 53 and the second portion 54 may be defined by the circularity. For example, a determination as to whether a shape is relatively similar to a circle may be made by referring to a difference between the maximum radius of curvature and the minimum radius of curvature defined in the JIS standard (JISB0621-1984). In this case, the second portion 54 may be have a shape with a smaller circularity than the first portion 53.

Preferably, the gap between adjacent cone-shaped parts 52 (e.g., 52a, 52b) is small, and the width or diameter φ of the cone-shaped part 52 is preferably nearly equal to the pitch p of the adjacent cone-shaped parts 52. The diameter φ of the cone-shaped part 52 is configured to be 0.85 times the pitch p or larger and, preferably, 0.9 times the pitch p or larger. By configuring the diameter φ of the cone-shaped part 52 to be 0.85 times the pitch p or larger, the proportion of the multiple cone-shaped parts 52 occupying a unit area in a plan view of the second principal surface 22b is ensured to be 65% or higher.

Figure 4:
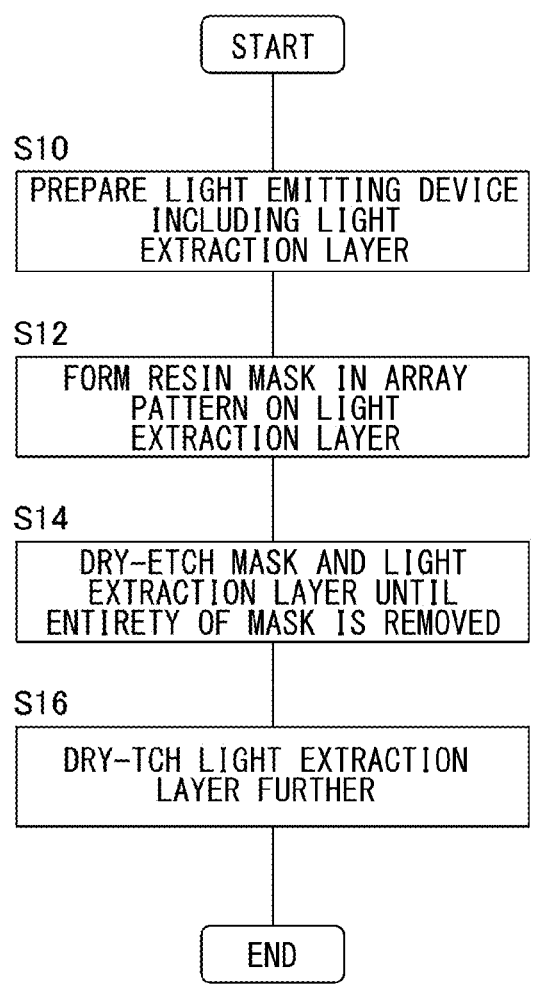
FIG. 4 is a flowchart showing a method of manufacturing the semiconductor light emitting device.

A description will now be given of a method of manufacturing the semiconductor light emitting device 10. FIG. 4 is a flowchart showing a method of manufacturing the semiconductor light emitting device 10. First, a light emitting device provided with a light extraction layer is prepared (S10), and a resin mask of an array pattern is formed on the light extraction layer (S12). Subsequently, a first dry-etching step is performed to dry-etch the mask and the light extraction layer from the above mask and etch the mask and the layer until the entirety of the mask is removed (S14). Subsequently, a second dry-etching step is performed to further dry-etch the light extraction surface after the mask is removed in the first dry-etching step (S16). In the embodiment, the first dry-etching step to remove the mask and the second dry-etching step to overetch the layer after the mask is removed are performed.

In the step of preparing the light emitting device, the substrate 22 not formed with the concave-convex structure 50 is prepared, and the first base layer 24, the second base layer 26, the n-type clad layer 32, the active layer 34, the electron blocking layer 36, and the p-type clad layer 38 are stacked successively on the first principal surface 22a of the substrate 22. The second base layer 26, the n-type clad layer 32, the active layer 34, the electron blocking layer 36, and the p-type clad layer 38 made of an AlGaN-based semiconductor material or a GaN-based semiconductor material can be formed by a well-known epitaxial growth method such as the metalorganic vapor phase epitaxy (MOVPE) method and the molecular beam epitaxy (MBE) method.

Subsequently, portions of the active layer 34, the electron blocking layer 36, and the p-type clad layer 38 stacked on the n-type clad layer 32 are removed to expose a partial region of the n-type clad layer 32. For example, by forming a mask on the p-type clad layer 38 except a partial region and then performing reactive ion etching or dry etching using plasma, portions of the active layer 34, the electron blocking layer 36, and the p-type clad layer 38 may be removed so as to expose the partial region of the n-type clad layer 32.

The n-side electrode 42 is then formed on the partial region of the n-type clad layer 32 exposed, and the p-side electrode 40 is formed on the p-type clad layer 38. The metal layers forming the p-side electrode 40 and the n-side electrode 42 may be formed by a well-known method such as electron beam deposition and sputtering.

The concave-convex structure 50 is then formed on the second principal surface 22b of the substrate 22. FIGS. 5~9 schematically show steps of manufacturing the concave-convex structure 50 and shows a step of processing a processed surface 60c of the light extraction layer 60 in which the concave-convex structure 50 has yet been formed. The light extraction layer 60 is a layer in which the light extraction surface should be formed and is a layer corresponding to the substrate 22 of the semiconductor light emitting device 10 shown in FIG. 1.

Figure 5:
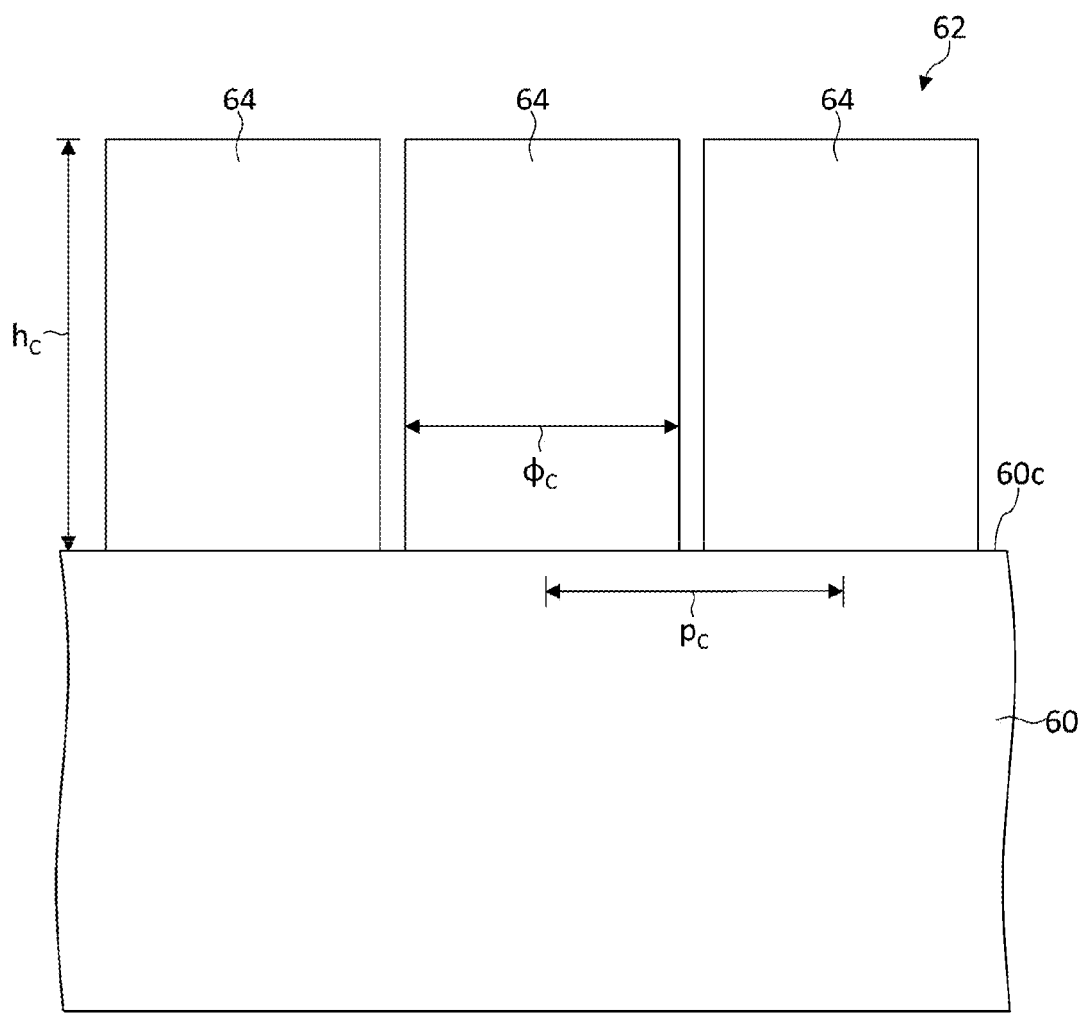
FIG. 5 schematically shows a step of manufacturing the concave-convex structure.

FIG. 5 shows a step of forming a mask 62 on the light extraction layer 60. For example, the processed surface 60c of the light extraction layer 60 is the (0001) plane (c plane) of the sapphire substrate. The mask 62 includes an array pattern corresponding to the cone-shaped parts 52 of the concave-convex structure 50 and includes a multiple columns 64 arranged in an array. The multiple columns 64 arranged in a triangular grid pattern, and each column has a prism or cylinder shape. The column 64 may be provided with a slight taper angle and may be shaped in a truncated pyramid or a truncated cone. For example, the mask 62 is formed by a resist resin by using the nanoimprinting technology. The method of forming the mask 62 is not limited to any particular method, and the mask 62 may be formed by using a lithographic technology based on exposure or electron-beam printing.

The mask 62 is formed such that the pitch $p_c$ of adjacent columns 64 is identical to the pitch p of the cone-shaped parts 52. The height $h_c$ of the column 64 is determined based on the height $h_0$ of a cone-shaped part 6 formed in the first dry-etching step (see FIG. 7, the detail will be described later) and the ratio between the etching rates of the light extraction layer 60 and the mask 62. Denoting the etching rate of the light extraction layer 60 by e and the etching of the mask 62 by $e_c$, the height h of the column 64 can be determined by an expression $h_c \approx h_0 * e_c/e$. The height $h_c$ of the column 64 may be slightly larger than the value given by the above expression or larger than the value $h_0 * e_c/e$ by about 5%~15%. The diameter $\varphi_c$ of the column 64 is smaller than the pitch $p_c$ of the columns 64 and is, for example, about 80%~95% of the pitch $p_c$. The diameter $\varphi_c$ of the column 64 may be smaller than the diameter φ of the cone-shaped part 52 ultimately formed.

A dry-etching process is then performed from above the mask 62. Reactive ion etching (RIE) may be used as a method of dry-etching the light extraction layer 60 and the mask 62. More specifically, plasma etching using inductive coupling plasma (ICP) may be used. The gas species used in plasma etching is not limited to any particular type, but it is preferred to use a chlorine-based gas such as chlorine ($Cl_2$) and boron trichloride ($BCl_3$) as an etching gas. By using an etching gas like the above, it is possible to suitably etch sapphire or aluminum nitride forming the light extraction layer 60 and etch the resist resin forming the mask 62.

Figure 6:
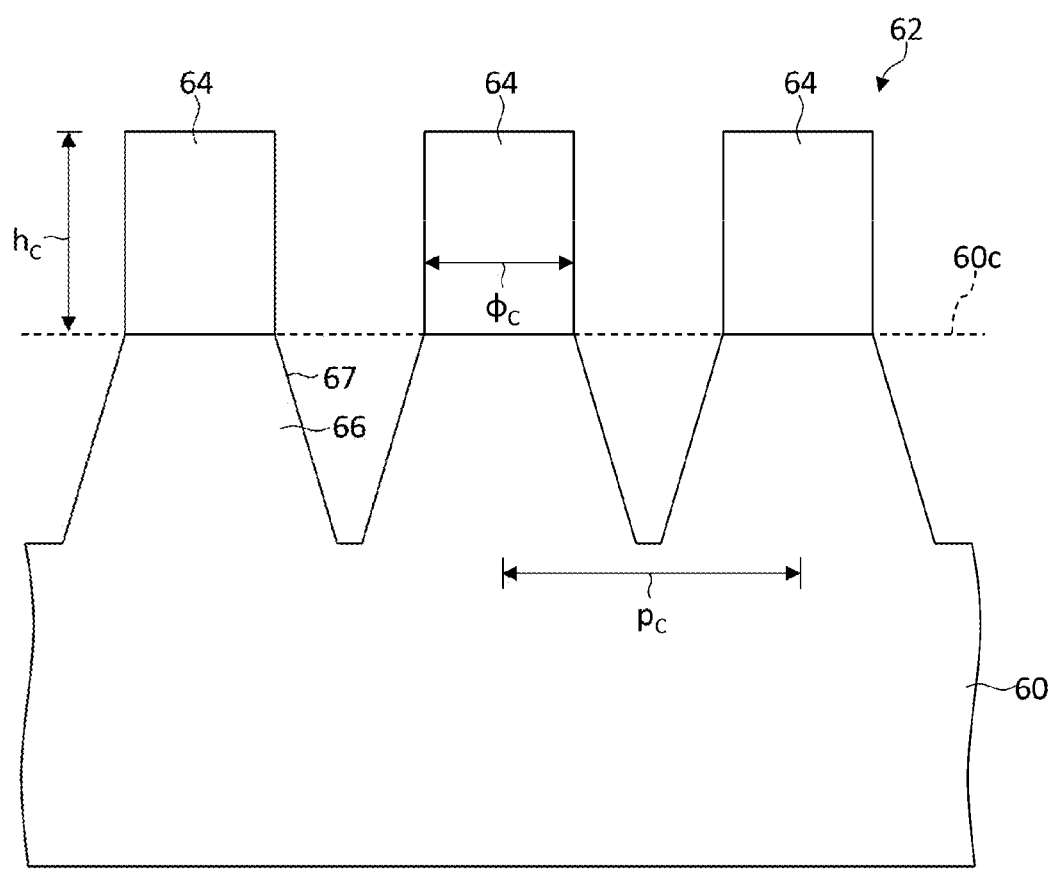
FIG. 6 schematically shows a step of manufacturing the concave-convex structure.

FIG. 6 schematically shows the dry-etched light extraction layer 60 and the mask 62 and shows a state in the middle of the first dry-etching step described above. In the first dry-etching step, the column 64 is isotropically etched from above and from side. As the etching step proceeds, the height $h_c$ and the diameter $\varphi_c$ of the column 64 grow smaller. Meanwhile, those portions of the light extraction layer 60 located below the mask 62 that are not covered with the mask 62 are etched. Since the covered area of the column 64 is reduced toward the center of the column 64 with time, the area of the light extraction layer 60 that is etched grows larger with time. As a result, the etching volume in the direction of depth of the light extraction layer 60 varies depending on the distance from the center of the column 64 with the result that the cone-shaped part 66 having an inclined surface 67 and similar to a truncated cone or a truncated pyramid is formed below the mask 62. The cone-shaped part 66 is formed at a position corresponding to the array pattern of the mask 62 and is formed in a position corresponding to each of the multiple columns 64.

Figure 7:
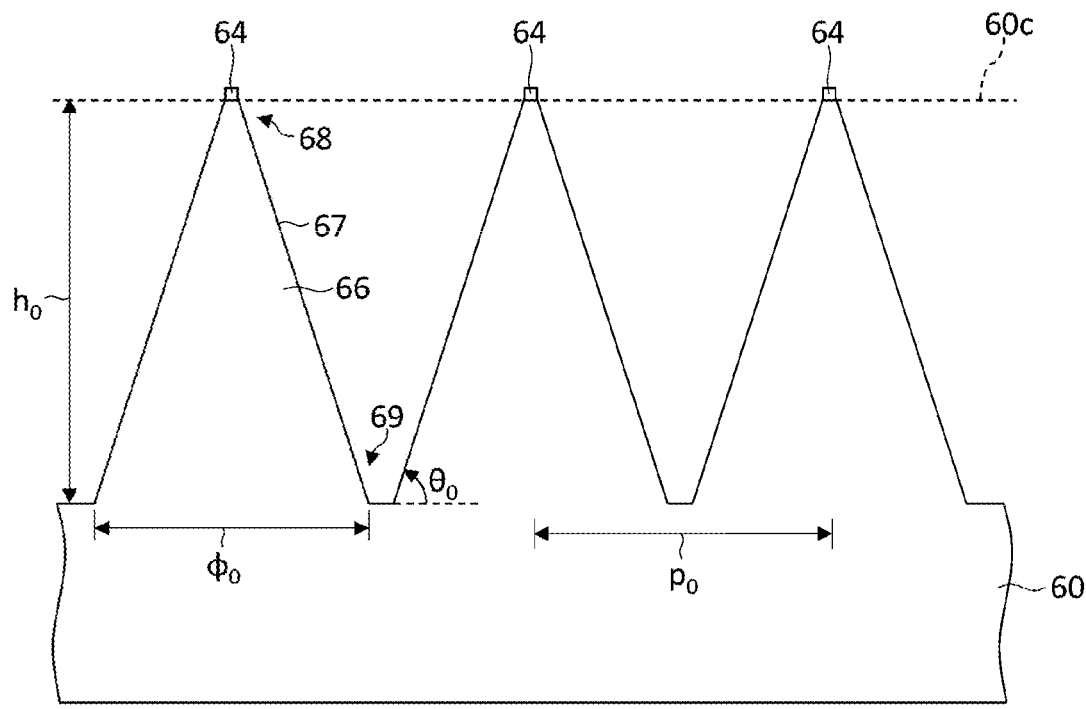
FIG. 7 schematically shows a step of manufacturing the concave-convex structure.

FIG. 7 schematically shows the dry-etched light extraction layer 60 and the mask 62 and shows a state that occurs immediately before the first dry-etching step is terminated. As the dry-etching step is allowed to proceed from the state shown in FIG. 6, the column 64 grows even smaller, and the entirety of the mask 62 is ultimately removed from above the light extraction layer 60. The light extraction layer 60 is etched such that the width (diameter) of the apex 68 of the cone-shaped part 66 becomes even smaller. As a result, the cone-shaped part 66 having a pointed apex 68 and similar to a cone or a pyramid in shape is formed.

The height $h_0$ of the cone-shaped part 66 formed in the first dry-etching step corresponds to the etching volume (also called the first etching volume) in the direction of depth by which the light extraction layer 60 is etched in the first dry-etching step and is given by an expression $h_0=h_c*e/e_c$, where $h_c$ denotes the initial height of the mask 62, e denotes the etching rate of the light extraction layer 60, and $e_c$ denotes the etching rate of the mask 62.

It is preferred that the cone-shaped part 66 be shaped in the first dry-etching step such that the aspect ratio $h_0/p_0$ of the height $h_0$ relative to the pitch $p_0$ is 1 or larger, and, more preferably, 1.1 or larger. Given that the pitch $p_0$ of the cone-shaped part 66 is 400 nm, for example, the height $h_0$ of the cone-shaped part 66 is preferably 440 nm or larger. By configuring the aspect ratio of the cone-shaped part 66 to be 1 or larger after the first dry-etching step, the aspect ratio h/p of the cone-shaped part 52 formed after the second dry-etching step may be of a suitable value (e.g., not less than 0.3 and not more than 1.0).

Unlike the cone-shaped part 52 shown in FIG. 2 described above, the cone-shaped part 66 after the first dry-etching step is formed such that the inclined surface 67 has a constant angle of inclination $\theta_0$. In other words, the cone-shaped part 66 after the first dry-etching step does not have the first portion and the second portion in which the angle of inclination varies in stages. The angle of inclination $\theta_0$ of the inclined surface 67 of the cone-shaped part 66 after the first dry-etching step is, for example, 50° or larger, or 60° or larger, though the angle may depend on the aspect ratio described above. Typically, the angle of inclination $\theta_0$ of the inclined surface 67 is smaller than the first angle $\theta_1$ and larger than the second angle $\theta_2$ (i.e., $\theta_1>\theta_0>\theta_2$).

Figure 8:
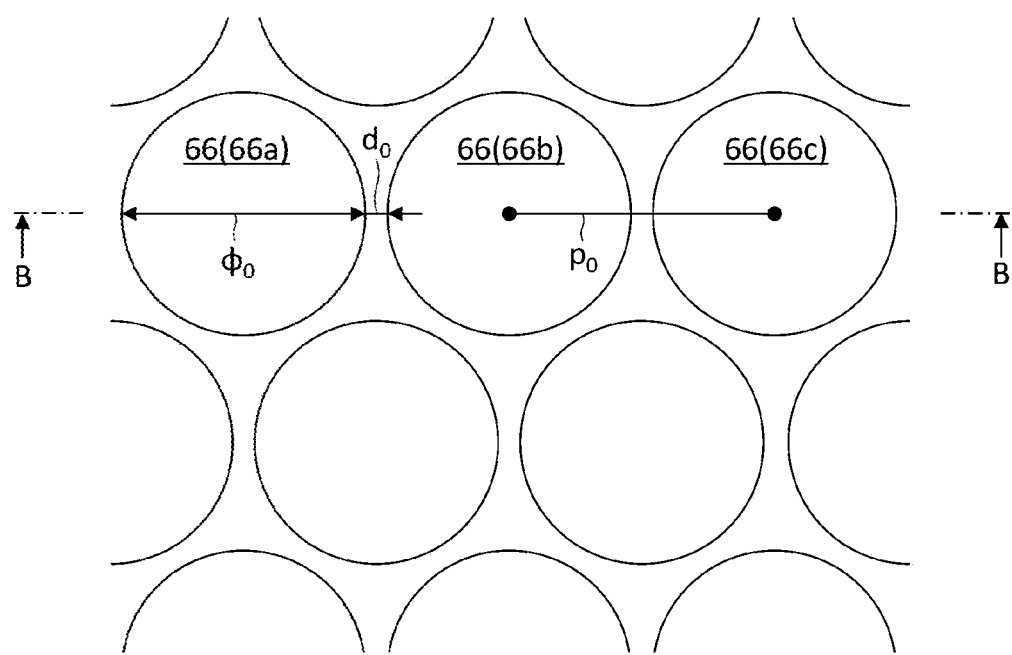
FIG. 8 schematically shows a step of manufacturing the concave-convex structure.

FIG. 8 is a top view schematically showing a configuration of multiple cone-shaped parts 66 shown in FIG. 7b (e.g., 66a, 66b, 66c) and shows a case where the cylindrical column 64 is used as the mask 62. FIG. 7 corresponds to a B-B cross section of FIG. 8. As shown in the figures, the outer profile of the cone-shaped part 66 after the first dry-etching step has a circular shape corresponding to the shape of the column 64 in a plan view of the processed surface 60c. A gap $d_0$ ($=p_0-\varphi_0$) is found between the multiple cone-shaped parts 66, and the magnitude of the gap $d_0$ is, for example, about 5%~20% of the pitch $p_0$. Providing the gap $d_0$ in the first dry-etching step secures a large aspect ratio (typically 1.1 or larger) of the cone-shaped part 66 as formed.

In the embodiment, the second dry-etching step for dry-etching the light extraction layer 60 further is performed after the entirety of the mask 62 is removed in the first dry-etching step. The second dry-etching step is a step with substantially the same etching condition as the first dry-etching step and is performed in continuation of the first dry-etching step. In other words, the second dry-etching step is performed to follow the first dry-etching step while the light emitting device remains housed in the etching process chamber. In one variation, the second dry-etching step may be performed in isolation from the first dry-etching step, or a certain addition process may be performed between the first dry-etching step and the second dry-etching step. Further, the processing conditions of the first dry-etching step and the second dry-etching step may differ. For example, processing conditions like etching gas, etching rate, etc. may differ.

Figure 9:
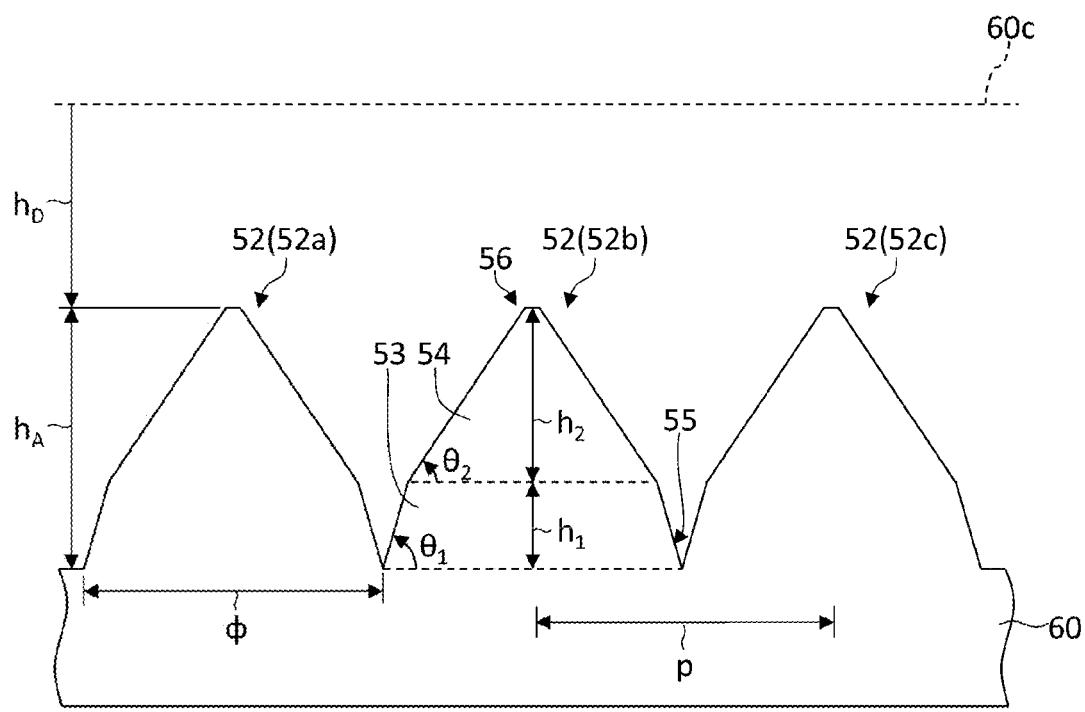
FIG. 9 schematically shows a step of manufacturing the concave-convex structure.

FIG. 9 is a cross-sectional view schematically showing a structure of the multiple cone-shaped parts 52 formed after the second dry-etching step. By further dry-etching the conical cone-shaped part 66 shown in FIG. 7, the cone-shaped part 52 having the first portion 53 and the second portion 54 with different angles of inclination is formed. The second dry-etching step is performed in the absence of the mask 62 and is a so-called maskless, free-running dry-etching process.

When the second dry-etching step is started, the apex 68 of the cone-shaped part 66 is pointed so that the electric field applied during plasma etching tends to be concentrated on the apex 68, causing the etching rate near the apex 68 to be relatively high. This is considered to result in the neighborhood of the apex 68 being etched more heavily and the second portion 54 having a relatively small angle of inclination $\theta_2$ being formed toward the apex 56.

In the second dry-etching step, the reaction product produced by dry-etching could be randomly attached (re-attached) to the surface of the light extraction layer 60. Since the etching rate near a bottom 69 of the cone-shaped part 66 shown in FIG. 7 is relatively low as compared to the rate near the apex 68, it is considered to be easy for the reaction product produced by dry-etching to be attached to the neighborhood of the bottom 69. This is considered to result in a larger amount of the reaction product attached to the neighborhood of the bottom 69 of the cone-shaped part 66, a larger diameter $\varphi$ of the cone-shaped part 52 after the second dry-etching than the diameter $\varphi_0$ of the cone-shaped part 66 shown in FIG. 7, and reduction in the gap $d_0$ between adjacent cone-shaped parts 66. In this way, the first portion 53 having the relatively larger angle of inclination $\theta_1$ as compared to that of the second portion 54 is formed. Further, the cone-shaped part 52 having an outer profile similar to a hexagon than a circle is formed in a plan view of the processed surface 60c, and the proportion of the area occupied by the multiple cone-shaped parts 52 per a unit area will be larger than that of the cone-shaped parts 66 shown in FIG. 7.

The shape of the cone-shaped part 52 formed after the second dry-etching step is suitably controlled by adjusting the shape of the cone-shaped part 66 before the second dry-etching step and the etching volume $h_0$ of the second dry-etching step. More specifically, the aspect ratio h/p of the cone-shaped part 52 after the second dry-etching step is configured to be of a suitable value by configuring the aspect ratio $h_0/p_0$ of the cone-shaped part 66 before the second dry-etching step to be of a certain value or larger. Further, the cone-shaped part 52 in which the height $h_1$ of the first portion 53 is larger than the height $h_2$ of the second portion 54 can be formed by configuring the etching volume $h_D$ in the second dry-etching step to be within a certain range.

Figure 10A:
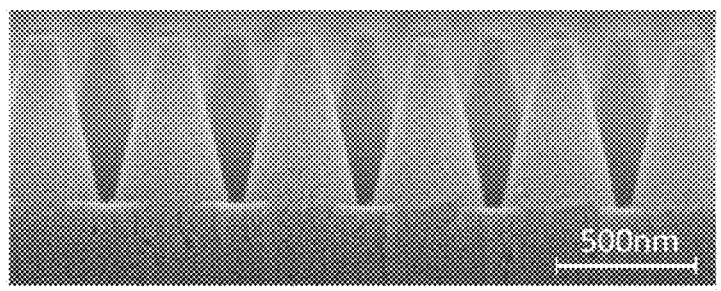
FIGS. 10A-10E are electron microscope images of the concave-convex structure.

FIGS. 10A-10E are electron microscope images of the concave-convex structure 50 according one example. FIG. 10A shows a concave-convex structure corresponding to the cone-shaped part 66 after the first dry-etching step and shows a constant angle of inclination of the side surface of the cone-shaped part. FIGS. 10B-10E show a concave-convex structure corresponding to the cone-shaped part 52 after the second dry-etching step and shows that the angle of inclination of the side surface of the cone-shaped part varies depending on the position in the direction of height. For ease of understanding, the first portion 53 and the second portion 54 of the cone-shaped part 52 are indicated in FIGS. 10B-10E by broken lines.

In the first example shown in FIG. 10A, the pitch p is about 460 nm, the diameter $\varphi$ is about 410 nm, the height is about 600 nm, and the angle of inclination θ of the inclined surface is about 75°. The aspect ratio h/p is about 1.3, and the proportion of the area occupied by the multiple cone-shaped parts per a unit area is about 72%. The first example exhibited an improvement of about 10% in light output over a light emitting device not provided with a concave-convex structure.

Figure 10B:
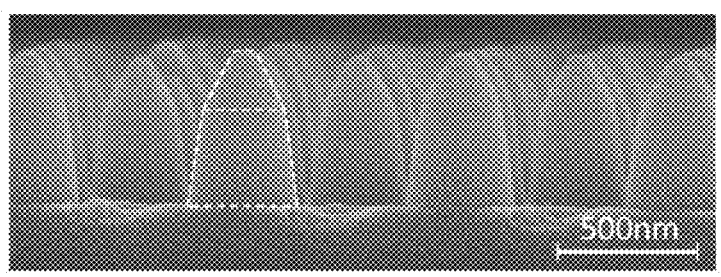

In the second example shown in FIG. 10B, the pitch p is about 460 nm, the diameter φ is about 380 nm, the height h is about 550 nm, the aspect ratio h/p is about 1.2, and the proportion of the area occupied by the multiple cone-shaped parts per a unit area is about 61%. The height $h_1$ of the first portion is about 340 nm, and the angle of inclination $\theta_1$ of the first portion is about 80°. The height $h_2$ of the second portion is about 210 nm, and the angle of inclination $\theta_2$ of the second portion is about 62°. The proportion of the height of the second portion $h_2/h_4$ is about 39%, and the angle difference $\Delta\theta$ between the first angle $\theta_1$ and the second angle $\theta_2$ is about 18°. In the second example, an improvement of about 25% in light output is exhibited over a light emitting device not provided with a concave-convex structure.

Figure 10C:
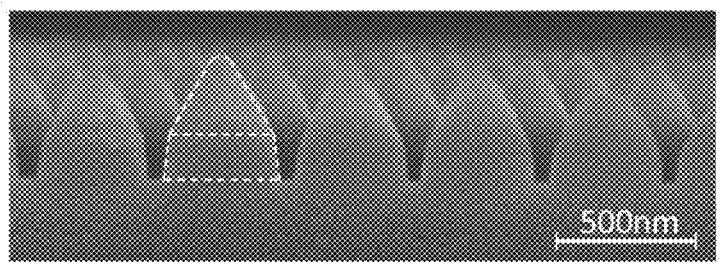

In the third example shown in FIG. 10C, the pitch p is about 460 nm, the diameter φ is about 420 nm, the height h is about 420 nm, the aspect ratio h/p is about 1.0, and the proportion of the area occupied by the multiple cone-shaped parts per a unit area is about 68%. The height $h_1$ of the first portion is about 160 nm, and the angle of inclination $\theta_1$ of the first portion is about 82°. The height $h_2$ of the second portion is about 260 nm, and the angle of inclination $\theta_2$ of the first portion is about 55°. The proportion of the height of the second portion $h_2/h_4$ is about 62%, and the angle difference $\Delta\theta$ between the first angle $\theta_1$ and the second angle $\theta_2$ is about 27°. In the third example, an improvement of about 34% in light output is exhibited over a light emitting device not provided with a concave-convex structure.

Figure 10D:

In the fourth example shown in FIG. 10D, the pitch p is about 460 nm, the diameter φ is about 460 nm, the height h is about 350 nm, the aspect ratio h/p is about 0.76, and the proportion of the area occupied by the multiple cone-shaped parts per a unit area is about 91%. The height $h_1$ of the first portion is about 120 nm, and the angle of inclination $\theta_1$ of the first portion is about 85°. The height $h_2$ of the second portion is about 230 nm, and the angle of inclination $\theta_2$ of the second portion is about 47°. The proportion of the height of the second portion $h_2/h_4$ is about 66%, and the angle difference $\Delta\theta$ between the first angle $\theta_1$ and the second angle $\theta_2$ is about 38°. In the fourth example, an improvement of about 34% in light output is exhibited over a light emitting device not provided with a concave-convex structure.

Figure 10E:
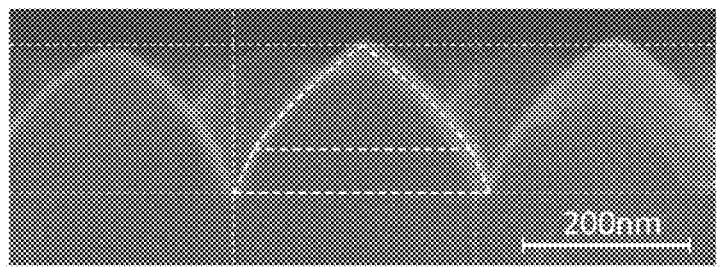

In the fifth example shown in FIG. 10E, the pitch p is about 310 nm, the diameter φ is about 310 nm, the height h is about 180 nm, and the aspect ratio h/p is about 0.58. The proportion of the area occupied by the multiple cone-shaped parts per a unit area is about 92%. The height $h_1$ of the first portion is about 55 nm, and the angle of inclination $\theta_1$ of the first portion is about 65°. The height $h_2$ of the second portion is about 125 nm, and the angle of inclination $\theta_2$ of the second portion is about 43°. The proportion of the height of the second portion $h_2/h_4$ is about 70%, and the angle difference $\Delta\theta$ between the first angle $\theta_1$ and the second angle $\theta_2$ is about 22°. In the fifth example, an improvement of about 30% in light output is exhibited over a light emitting device not provided with a concave-convex structure.

Figure 11:
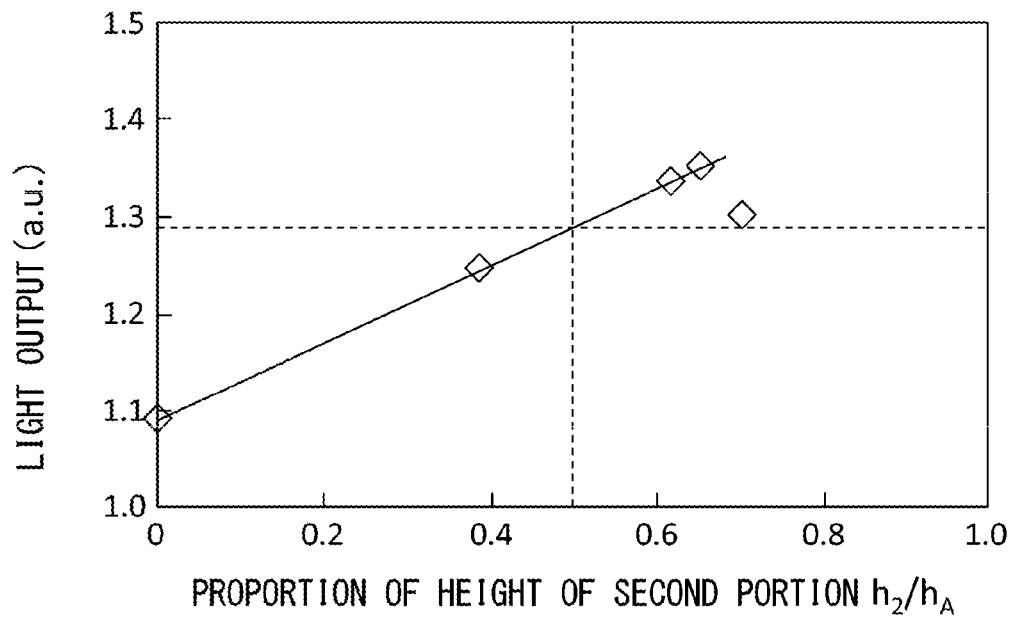
FIG. 11 is a graph showing a relationship between the proportion of the height of the second portion of the concave-convex structure according to the examples and the light output.

FIG. 11 is a graph showing a relationship between the proportion of the height $h_2$ of the second portion 54 of the concave-convex structure 50 according to the examples and the light output. As illustrated, the light output is improved by increasing the proportion of the height of the second portion 54. The graph reveals that the light output is suitably improved by configuring the proportion of the height of the second portion 54 to be 50% or larger, i.e., by configuring the height $h_2$ of the second portion 54 to be larger than the height $h_1$ of the first portion 53. The graph also shows that the rate of improvement in light output tends to drop when the proportion of the height of the second portion 54 exceeds 66%, i.e., when the height $h_2$ of the second portion 54 is far more than twice the height $h_1$ of the first portion 53. Therefore, the height $h_2$ of the second portion 54 is preferably around twice the height $h_1$ of the first portion 53 and, more preferably, not less than 1.1 times and not more than three times the height $h_1$ of the first portion.

Figure 12:
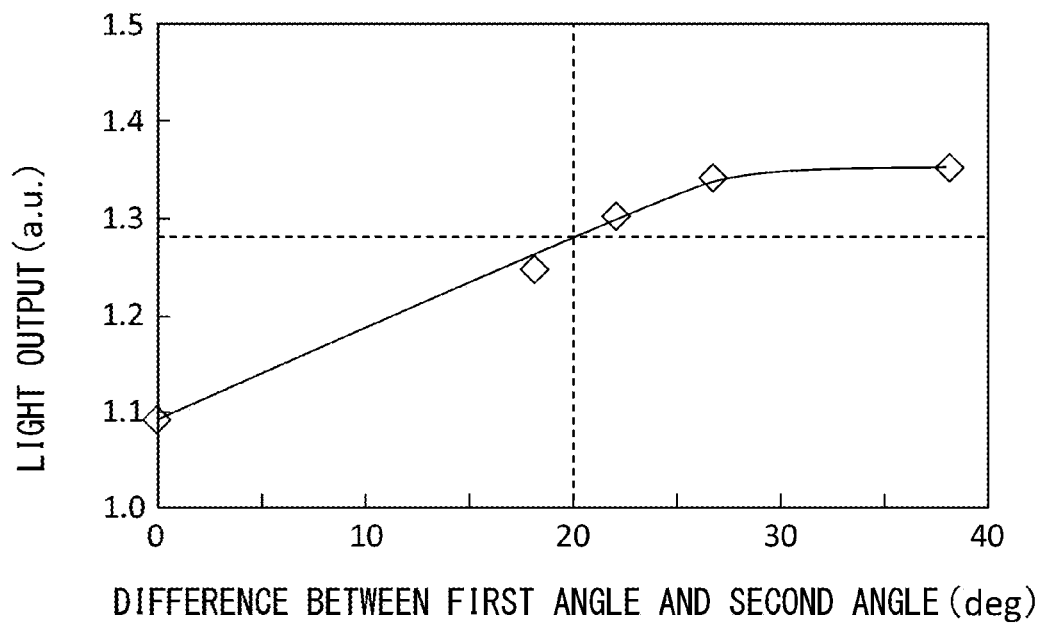
FIG. 12 is a graph showing a relationship between the difference between the first angle and the second angle of the concave-convex structure according to the examples and the light output.

FIG. 12 is a graph showing a relationship between the difference $\Delta\theta$ between the first angle $\theta_1$ and the second angle $\theta_2$ of the concave-convex structure 50 according to the examples and the light output. The figure reveals that the light output is improved by increasing the difference $\Delta\theta$ between the first angle $\theta_1$ and the second angle $\theta_2$ and that the light output is suitably improved by configuring the angle difference $\Delta\theta$ to be 20° or larger.

Figure 13:
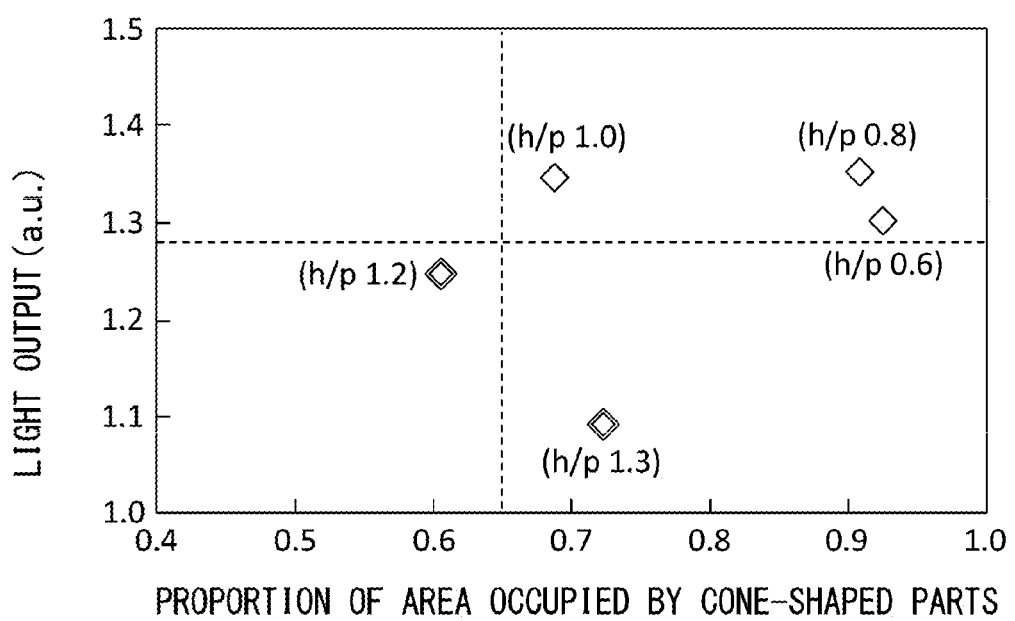
FIG. 13 is a graph showing a relationship between the proportion of the area occupied by the concave-convex structure according to the examples and the light output.

FIG. 13 is a graph showing a relationship between the proportion of the area occupied by the concave-convex structure 50 according to the examples and the light output. The graph also shows the values of aspect ratio h/p of the concave-convex structure 50. The graph reveals that the light output is suitably improved by controlling the aspect ratio h/p to be 1.0 or smaller and, at the same time, increasing the proportion of the area occupied by the cone-shaped part 52, instead of preferentially increasing the aspect ratio h/p of the concave-convex structure 50. For example, a higher light output is obtained by configuring the aspect ratio h/p of the concave-convex structure 50 to be 1.0 and the proportion of the area to be about 68% rather than by configuring the aspect ratio h/p of the concave-convex structure 50 to be 1.2 and the proportion of the area to be about 60%. Therefore, the light output is suitably improved by configuring the proportion of the area to be 65% or larger at the cost of somewhat smaller aspect ratio (e.g., not less than 0.3 and not more than 1.0). Further, by configuring the shape of the outer profile of the cone-shaped part 52 to be similar to a hexagon, the proportion of the area is configured to be 91% or larger, with the result that the light output is suitably improved even if the aspect ratio h/p is 0.8 or smaller.

According to the embodiment, the light output of the concave-convex structure 50 is improved by configuring the height $h_2$ of the second portion 54 having a smaller angle of inclination of the side surface to be larger than the height $h_1$ of the first portion 53 having a larger angle of inclination of the side surface. It should be noted that such an advantage is directly opposite to what we expected. We also determined the correlation between the heights $h_1$, $h_2$ of the first portion 53 and the second portion 54 and the light output of the concave-convex structure 50 by numerical computation (simulation) and found out a result opposite to that of the embodiment described above. In other words, the numerical computation showed an increase in the light output by configuring the height $h_1$ of the first portion 53 to be larger than the height $h_2$ of the second portion. While the reason for the difference between the light output value of the concave-convex structure 50 determined by the numerical computation and the light output value of the concave-convex structure 50 actually manufactured is unknown, the difference is considered to result from the impact from multipath reflection and multiple scattering inside the concave-convex structure 50, the impact from the variation in the shape and size of the individual cone-shaped parts 52 of the concave-convex structure 50 manufactured.

The variation in the shape and size of the individual cone-shaped parts 52 of the concave-convex structure 50 is considered to be due to the variation in the shape of the mask 62 (column 64) formed on the light extraction layer 60. The shape of the cone-shaped part 52 discussed above is greatly affected by the etching volume in the second dry-etching step after the column 64 of the mask 62 is removed. Therefore, the variation in the shape of the mask 62 results in a shift between points of time of start of the second dry-etching step, and the shift could cause a difference in the shape of the cone-shaped parts 52. For example, formation of the mask 62 using a common deposition device creates the variation of about ±5% in the film thickness within the plane, which creates the variation of a maximum of 10% in the film thickness of the mask 62. Further, the dry-etching selection ratio between the mask 62 and the light extraction layer 60 is about 3~5 so that the variation of about 30%~50% in the film thickness of the mask 62 is created in the cone-shaped parts 52. Further, the variation in the etching volume in the dry-etching step of about ±5% is created within the plane. Consequently, given that initial film thickness $h_c$ of the mask 62 is 150 nm and the cone-shaped part 66 of the height $h_0$ of 600 nm is formed after the first dry-etching step, for example, the variation of about 135 nm is created in the height $h_A$ of the cone-shaped parts 52 as a sum of the variation caused by the mask (maximum of about 75 nm) and the variation in the dry-etching step (maximum of about 60 nm).

The amount of variation in the height of the cone-shaped parts 52 described above represents about 10~50% of the height $h_A$ of the cone-shaped parts 52 ultimately formed and could occur randomly within the plane of the light extraction surface. In this embodiment, the diffraction effect obtained by uniformly shaping the cone-shaped parts 52 is not positively utilized so that it is unlikely that the extraction efficiency drops due to the variation in the shape of the cone-shaped parts 52. Rather, the variation in the shape of the multiple cone-shaped parts 52 and resultant variation in the orientation of light that can be extracted in the individual cone-shaped parts 52 are expected to provide the advantage of enabling light in various direction to be extracted in the concave-convex structure 50 as a whole. Thus, significant benefit and advantage that could not be expected from the result based on numerical computation are realized according to the embodiment.

According to the embodiment, the proportion of the area occupied by the ultimate cone-shaped parts 52 is increased by forming the cone-shaped part 66 of a high aspect ratio in the first dry-etching step and then performing the second dry-etching step. It can therefore be said that the aspect ratio of the cone-shaped part 52 and the proportion of the occupied area are in a trade-off in this embodiment. In the related art, the concave-convex shape of a high aspect ratio has been considered desirable for improvement of the light output using a concave-convex structure. It has been considered important to increase the aspect ratio of the concave-convex structure as much as possible. However, our finding demonstrated that improvement in the light output is realized by increasing the proportion of the area occupied by the concave-convex shape to 65% or larger at the cost of somewhat smaller aspect ratio (e.g., not less than 0.3 and not more than 1.0). Also, further improvement in the light output is realized by configuring the outer profile of the first portion 53 of the cone-shaped part 52 to have a shape similar to a hexagon to increase the proportion of the area occupied by the concave-convex shape to 91% or larger. Thus, the embodiment provides the semiconductor light emitting device 10 in which the light output from the light extraction surface is improved and the external output efficiency is higher than in the related art.

According to the embodiment, only one type of mask need be used to form the cone-shaped part 52 having the first portion 53 and the second portion 54 so that the manufacturing steps are simplified, and the manufacturing cost is reduced. In the related art, an attempt to form a concave-convex shape with a graded inclination has required application of multiple types of masks suited to the concave-convex shape sought to be formed and so has required the number of steps corresponding to the number of types of masks used. Meanwhile, according to the embodiment, only one type of mask need be used, and the first dry-etching step and the second dry-etching step may be performed continuously. Therefore, the number manufacturing steps is reduced. Thus, according to the embodiment, the light extraction efficiency of the semiconductor light emitting device 10 is improved, while also preventing the manufacturing cost from being increased.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment described above, the concave-convex structure 50 is shown as being formed on the second principal surface 22b of the substrate 22. In one variation, the concave-convex structure 50 may be formed on a further layer formed on the second principal surface 22b of the substrate. For example, a third base layer may be formed on the second principal surface 22b, and the concave-convex structure 50 may be formed on the third base layer. The third base layer is preferably made of a material having a lower refractive index than the active layer 34 and a higher refractive index than the substrate 22 for the wavelength of the deep ultraviolet light emitted by the active layer 34. Given that the substrate 22 is made of sapphire (the refractive index $n_1$=about 1.8) and the active layer 34 is a made of an AlGaN-based semiconductor material (the refractive index $n_3$=about 2.4~2.6), it is desirable that the third base layer be made of AlN (the refractive index $n_4$=about 2.1) or an AlGaN-based semiconductor material having a relatively higher AlN composition ratio (the refractive index $n_4$=about 2.2~2.3). The third base layer may be made of silicon nitride ($SiN_x$, the refractive index $n_4$=about 1.9~2.1), silicon oxynitride (SiON), silicon oxide ($SiO_2$), or aluminum oxide ($Al_2O_3$). It is preferred that the third base layer have a high transmittance for the deep ultraviolet light emitted by the active layer 34 and be configured to have an internal transmittance of 90% or higher.

The method of forming the cone-shaped part 52 having the first portion 53 and the second portion 54 by using one type of mask has been described in the embodiment, but the method of manufacturing the cone-shaped part 52 is not limited to the method described above, and an alternatively method may be used. For example, the cone-shaped part 52 having the first portion 53 and the second portion 54 may be formed by combining two or more types of mask. Alternatively, different types of mask may be applied to multiple dry-etching steps. For example, the second etching step may be performed by applying the second type of mask after the first etching step using the first type of mask.

In the embodiment and the variations, a description is given of a case of forming the concave-convex structure 50 on the light extraction layer after the light emitting structure 30 is formed. In a further variation, the light emitting structure 30 may be formed after the concave-convex structure 50 is formed on the light extraction layer. For example, the substrate 22 on which the concave-convex structure 50 is formed in advance may be prepared, and the light emitting structure 30 may be formed on the substrate.

In the embodiment and the variations, a description is given of a case of forming the concave-convex structure 50 in the semiconductor light emitting device 10 for outputting deep ultraviolet light. In a further variation, the concave-convex structure 50 described above may be applied to a semiconductor light emitting device for outputting light other than deep ultraviolet light. For example, the concave-convex structure 50 may be applied to a light emitting device for outputting ultraviolet light of 360 nm~400 nm or a light emitting device for outputting blue light of 400 nm~450 nm. Further, the concave-convex structure 50 may be applied to a light emitting device for outputting visible light such as green light, yellow light, and red light or to a light emitting device for outputting infra-red light.

One embodiment of the disclosure is summarized below.

1. A semiconductor light emitting device including a light extraction layer having a light extraction surface, multiple cone-shaped parts formed in an array being provided on the light extraction surface, wherein a proportion of an area occupied by the multiple cone-shaped parts per a unit area of the light extraction surface is not less than 65% and not more than 95% in a plan view of the light extraction surface, and an aspect ratio h/p defined as a proportion of a height h of the cone-shaped part relative to a distance p between apexes of adjacent cone-shaped parts is not less than 0.3 and not more than 1.0.

2. In a plan view of the light extraction surface, a bottom the cone-shaped part may have a shape of a hexagon or a shape intermediate between a hexagon and a circle, and the proportion of the area occupied by the multiple cone-shaped parts per a unit area of the light extraction surface may be not less than 91% and not more than 95%.

3. In a cross-sectional view perpendicular to a direction of height of the cone-shaped part, a neighborhood of the bottom of the cone-shaped part has a hexagonal shape or a shape intermediate between a hexagon and a circle, and a neighborhood of the apex of the cone-shaped part may have a shape closer to a circle than the neighborhood of the bottom.

4. The cone-shaped part may have a first portion having a first angle of inclination of a side surface and a second portion having a second angle of inclination of a side surface smaller than the first angle, and the second portion may be closer to the apex of the cone-shaped part than the first portion and have a larger height than the first portion.

5. A height of the second portion may be not less than 1.1 times and not more than three times a height of the first portion.

6. The first angle may be not less than 60° and not more than 85°, and the second angle may be not less than 40° and not more than 60°.

7. The semiconductor light emitting device may include: a base structure including at least one of a sapphire ($Al_2O_3$) layer and an aluminum nitride (AlN) layer; and a light emitting structure formed on the base structure and including an aluminum gallium nitride (AlGaN)-based or a gallium nitride (GaN)-based semiconductor layer that emits ultraviolet light of a wavelength of not less than 200 nm and not more than 400 nm, and the light extraction layer may be the sapphire ($Al_2O_3$) layer, the AlN layer or a silicon oxide ($SiO_x$) layer, or a silicon nitride ($SiN_x$) or an aluminum oxide layer ($Al_2O_3$) of the base structure.

8. A method of manufacturing a semiconductor light emitting device including a light extraction layer having a light extraction surface, the method comprising:

forming a mask having an array pattern on the light extraction layer; and etching the mask and the light extraction layer from above the mask, wherein the etching may include first dry-etching for dry-etching the mask and the light extraction layer until the entirety of the mask is removed and second dry-etching for further dry-etching the light extraction layer after the mask is removed, multiple cone-shaped parts may be formed in an array on the light extraction surface in the first dry-etching such that an aspect ratio h/p defined as a proportion of a height h of the cone-shaped part relative to a distance p between apexes of adjacent cone-shaped parts is 1.1 or larger, and the multiple cone-shaped parts are further etched in the second dry-etching such that the aspect ratio h/p of the cone-shaped part is not less than 0.3 and not more than 1.0.

9. A semiconductor light emitting device including a light extraction layer having a light extraction surface, multiple cone-shaped parts formed in an array being provided on the light extraction surface, wherein the cone-shaped part has a first portion having a first angle of inclination of a side surface and a second portion having a second angle of inclination of a side surface smaller than the first angle, and the second portion is closer to an apex of the cone-shaped part than the first portion and has a larger height than the first portion.

10. A height of the second portion may be not less than 50% and not more than 80% of a height of the cone-shaped part.

11. The first angle may be not less than 60° and not more than 85°, and the second angle may be not less than 40° and not more than 60°.

12. A difference between the first angle and the second angle may be 20° or larger.

13. A proportion of an area occupied by the multiple cone-shaped parts per a unit area of the light extraction surface may be not less than 65% and not more than 95% in a plan view of the light extraction surface.

14. In a cross-sectional view perpendicular to a direction of height of the cone-shaped part, the first portion may have a hexagonal shape or a shape intermediate between a hexagon and a circle, and the second portion may have a shape closer to a circle than the first portion.

15. A method of manufacturing a semiconductor light emitting device including a light extraction layer having a light extraction surface, the method comprising:

forming a mask having an array pattern on the light extraction layer; and etching the mask and the light extraction layer from above the mask, wherein the etching may include first dry-etching for dry-etching the mask and the light extraction layer until the entirety of the mask is removed and second dry-etching for further dry-etching the light extraction layer after the mask is removed, multiple cone-shaped parts are formed in an array on the light extraction surface in the first dry-etching, and the multiple cone-shaped parts are further etched in the second dry-etching to form the cone-shaped part having a first portion having a first angle of inclination of a side surface and a second portion having a second angle of inclination of a side surface smaller than the first angle.

What is claimed is:

1. A semiconductor light emitting device, comprising
a light extraction layer having a light extraction surface; and
multiple cone-shaped parts formed in an array being provided on and protruding from the light extraction surface,
wherein a proportion of an area occupied by the multiple cone-shaped parts per a unit area of the light extraction surface is not less than 65% and not more than 95% in a plan view of the light extraction surface,
an aspect ratio h/p defined as a proportion of a height h of the cone-shaped part relative to a distance p between apexes of adjacent cone-shaped parts is not less than 0.3 and not more than 1.0, and
in a cross-sectional view perpendicular to a direction of the height of the cone-shaped part, the cone-shaped part has a first portion having a shape of a hexagon or a shape intermediate between a hexagon and a circle and has a second portion having a shape closer to a circle than the first portion, and
the second portion is closer to the apex of the cone-shaped part than the first portion and has a larger height than the first portion.

2. The semiconductor light emitting device according to claim 1,
wherein in the plan view of the light extraction surface, a bottom of the cone-shaped part has a shape of a hexagon or a shape intermediate between a hexagon and a circle, and the proportion of the area occupied by the multiple cone-shaped parts per a unit area of the light extraction surface is not less than 91% and not more than 95%.

3. The semiconductor light emitting device according to claim 1,
wherein the first portion has a first angle of inclination of a side surface and the second portion has a second angle of inclination of a side surface smaller than the first angle.

4. The semiconductor light emitting device according to claim 3, wherein
the first angle is not less than 60° and not more than 85°, and the second angle is not less than 40° and not more than 60°.

5. The semiconductor light emitting device according to claim 1, wherein
a height of the second portion is not less than 1.1 times and not more than three times a height of the first portion.

6. The semiconductor light emitting device according to claim 1,
further comprising:
a base structure including at least one of a sapphire ($Al_2O_3$) layer and an aluminum nitride (AlN) layer; and
a light emitting structure formed on the base structure and including an aluminum gallium nitride (AlGaN)-based or a gallium nitride (GaN)-based semiconductor layer that emits ultraviolet light of a wavelength of not less than 200 nm and not more than 400 nm, and
the light extraction layer is the sapphire ($Al_2O_3$) layer, the AlN layer or a silicon oxide ($SiO_x$) layer, or a silicon nitride layer ($SiN_x$) or an aluminum oxide layer ($Al_2O_3$) of the base structure.

* * * * *